US009369108B2

(12) United States Patent
Guenego (10) Patent No.: US 9,369,108 B2
(45) Date of Patent: Jun. 14, 2016

(54) CORRECTION OF THE PASSBAND OF AN AIR GAP TRANSFORMER (71) Applicant: SCHNEIDER ELECTRIC INDUSTRIES SAS, Rueil-Malmaison (FR)

(72) Inventor: Michel Guenego, Mauguio (FR)

(73) Assignee: SCHNEIDER ELECTRIC INDUSTRIES SAS, Rueil-Malmaison (FR)

(*) Notice: Subject to any disclaimer, the term of this patent is extended or adjusted under 35 U.S.C. 154(b) by 0 days.

(21) Appl. No.: 14/336,091

(22) Filed: Jul. 21, 2014

(65) Prior Publication Data
US 2015/0035592 A1    Feb. 5, 2015

(30) Foreign Application Priority Data
Jul. 31, 2013    (FR) ..................... 13 57603

(51) Int. Cl.
*H04B 3/14* (2006.01)
*H03H 7/01* (2006.01)
*G01R 15/18* (2006.01)
(Continued)

(52) U.S. Cl.
CPC ........... *H03H 7/0161* (2013.01); *G01R 15/183* (2013.01); *H01F 27/427* (2013.01); *H03F 3/45475* (2013.01); *H03H 7/0107* (2013.01); *H03H 11/126* (2013.01); *H04B 3/14* (2013.01); *H03F 2203/45512* (2013.01); *H03F 2203/45526* (2013.01); *H03F 2203/45528* (2013.01); *H03F 2203/45544* (2013.01); *H03F 2203/45594* (2013.01); *H03H 2250/00* (2013.01)

(58) Field of Classification Search
CPC ...... G01R 15/00; G01R 15/183; H01F 27/00; H01F 27/427; H03F 2203/00; H03F 2203/45512; H03F 2203/45526; H03F 2203/45528; H03F 2203/45544; H03F 2203/45594; H03F 3/00; H03F 3/45475
USPC ........................................ 327/557
See application file for complete search history.

(56) References Cited

U.S. PATENT DOCUMENTS

| 3,564,441 A * | 2/1971 | Eide ............... H03H 11/126 330/103 |
| 2014/0159704 A1 * | 6/2014 | Rathsmann ........ G01R 15/183 324/117 R |

FOREIGN PATENT DOCUMENTS

FR    1.596.405    6/1970

OTHER PUBLICATIONS

French Preliminary Search Report issued Apr. 1, 2014, in Patent Application No. FR 1357603, filed Jul. 31, 2013 (with English Translation of Category of Cited Documents).

(Continued)

*Primary Examiner* — John Poos
*Assistant Examiner* — David Mattison
(74) *Attorney, Agent, or Firm* — Oblon, Mclelland, Maier & Neustadt, L.L.P.

(57) ABSTRACT

Device for correction of the passband of an air gap transformer with a cut-off frequency, characterized in that it includes a filter adapted to be connected to the transformer in series, and in that the filter is adapted to amplify the signal that it receives from the transformer for frequencies below the cut-off frequency of the transformer, so that the passband of the transformer fitted with the correction device is increased and has a cut-off frequency lower than the cut-off frequency of the transformer.

9 Claims, 6 Drawing Sheets

(51) Int. Cl.
*H01F 27/42* (2006.01)
*H03F 3/45* (2006.01)
*H03H 11/12* (2006.01)

(56) References Cited

OTHER PUBLICATIONS

W F Ray, "Rogowski Transducers for High Bandwidth High Current Measurement", The Institution of Electrical Engineers, XP 006503545, Nov. 2, 1994, pp. 10/1-10/6.

Q. Lu, et al., "A DFT-Based Approach for Precise Tuning of a Band-Pass Filter for the Extraction of Control Signals from Power Lines", Proceedings of the International Conference on Industrial Electronics, Control, Instrumentation, and Automation, Power Electronics and Motion Control, vol. 1 of 3, XP 000369006, Nov. 9, 1992, pp. 530-535.

James E. Lafser, et al., "A Versatile RC-Active Circuit for Instrumentation", Proceedings of the $32^{ND}$ Midwest Symposium on Circuits and Systems, XP 000139640, Aug. 14- 16, 1989, pp. 177-180.

\* cited by examiner

CORRECTION OF THE PASSBAND OF AN AIR GAP TRANSFORMER

TECHNICAL FIELD

This invention relates to electrical transformers in general, and particularly air gap transformers like those used especially for making current measurements in an electrical installation.

STATE OF PRIOR ART

If an electric line fitted with a circuit breaker is considered, a transient current is superposed on the nominal current when the circuit breaker is closed. This transient current has a relatively high intensity compared with the nominal current.

The transient current must be taken into account to design a measurement transformer installed on this electrical line.

A transformer has an iron core and one of its characteristics is that it becomes saturated starting at a given current passing through it. Therefore the transformer has to be designed to avoid saturation for an expected transient current.

A Rogowski coil is a device without an iron core for measuring alternating current. The saturation phenomenon is avoided but a Rogowski coil is sensitive to electromagnetic disturbances and this type of device is not used in practice in medium and high voltage installations.

In practice, measurement transformers are transformers with no air gap or with a minimal air gap. The presence of an air gap pushes the saturation to a higher level. In other words, the current at which saturation occurs is higher in an air gap transformer than in a transformer with the same dimensions but without an air gap.

Figure 1:
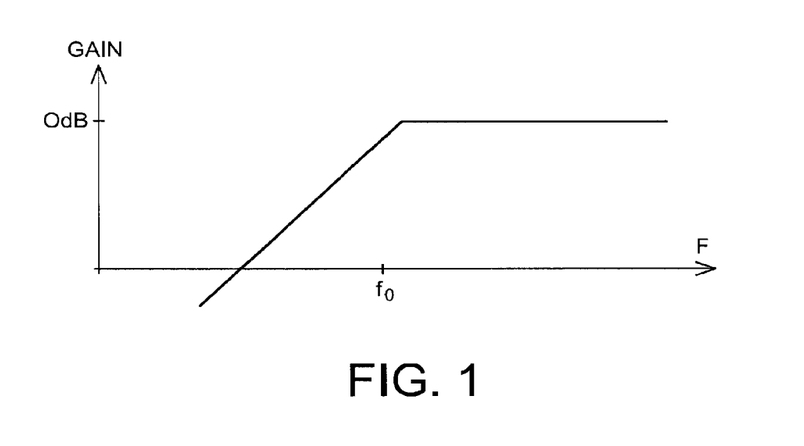
FIG. 1 shows the transfer function of an air gap transformer.

However, an air gap transformer performs a transfer function that can be modelled by a first order high pass filter transfer function. As shown in FIG. 1, the transfer function is an increasing straight line below a cut-off frequency $f_0$ and then has a constant gain above the cut-off frequency. The cut-off frequency increases as the air gap increases.

Thus, frequencies lower than the cut-off frequency are attenuated and their phases are shifted. In other words this high pass or derivative filter eliminates the DC component of the signal. This filtering is an unwanted consequence of the presence of the air gap that has the purpose of reducing the saturation phenomenon and therefore the dimensions of the transformer with given performances. Therefore a compromise has to be found between performance, design, saturation and filtering. The need for precision prevents a significant air gap from being used in practice.

PRESENTATION OF THE INVENTION

The invention is aimed at solving the problems according to prior art by providing a device for correction of the passband of an air gap transformer with a cut-off frequency, characterised in that it comprises a filter adapted to be connected to the transformer in series, and in that the filter is adapted to amplify the signal that it receives from the transformer for frequencies below the cut-off frequency of the transformer so that the passband of the transformer fitted with the correction device is increased and has a cut-off frequency lower than the cut-off frequency of the transformer.

The passband of the air gap transformer fitted with the correction device is thus similar to the passband of a transformer without an air gap or with a smaller air gap. With the invention, air gap transformers for which the low frequency filtering problem is reduced or eliminated can be designed, which simplifies the question of finding a compromise between performance, design and saturation.

For example, for a given performance, it is possible to design a smaller, lighter weight, less expensive transformer, with good capacity for not saturating in the presence of a transient current.

It should be noted that the air gap transformer fitted with the correction device according to the invention is much less sensitive to electromagnetic disturbances than a Rogowski coil.

The correction device may be used in the air gap transformer, or in a protection relay, or in a digital processing system.

The correction device acts as an air gap reducer while maintaining the benefits of the air gap.

According to one preferred characteristic, the filter is a first order filter for which the cut-off frequency is equal to the transformer cut-off frequency.

According to another preferred characteristic, the filter is a filter with order greater than or equal to two with a cut-off frequency lower than the cut-off frequency of the transformer, adapted to act like a derivative filter for frequencies lower than the cut-off frequency of the filter, like an integrator filter for frequencies between the cut-off frequency of the filter and the cut-off frequency of the transformer, and with a constant gain for frequencies higher than the cut-off frequency of the transformer.

According to one preferred characteristic, the correction device is implemented analogically.

According to an alternative preferred characteristic, the correction device is implemented digitally.

The invention also relates to an air gap transformer fitted with a device like that presented above.

The invention also relates to a protection relay fitted with a device like that presented above and adapted to be connected to the output side of an air gap transformer.

The invention also relates to a method for correction of the passband of an air gap transformer with a cut-off frequency, characterised in that it includes steps to:
  measure values of a current signal at the output from the air gap transformer,
  apply filtering to measured values that amplifies the current signal for frequencies lower than the transformer cut-off frequency, such that the passband of the transformer fitted with the correction device is enlarged and has a cut-off frequency lower than the cut-off frequency of the transformer.

The air gap transformer, the protection relay and the method have similar advantages to those mentioned above.

In one particular embodiment, the steps in the method according to the invention are performed through computer program instructions.

Consequently, the invention also relates to a computer program on an information medium, this program possibly being used in a computer, this program comprising instructions adapted to perform the steps in a method like that described above.

This program can be written in any programming language, and may be in the form of a source code, object code or code intermediate between the source code and the object code such as in a partially compiled form, or in any other desirable form.

The invention also relates to an information medium that can be read by a computer and that contains computer program instructions adapted for application of the steps in a method like that described above.

The information medium may be any entity or device capable of storing the program. For example, the medium may include a storage means such as a ROM, for a example a CD ROM or a microelectronic circuit ROM, or a magnetic recording means, for example a diskette or a hard disk.

Furthermore, the information medium may be a transmittable support such as an electrical or optical signal and it may be routed by an electrical or optical cable, or by radio or by other means. In particular, the program according to the invention may be downloaded from an Internet type network.

Alternately, the information support may be an integrated circuit in which the program is included, the circuit being adapted to execute or to be used in execution of the method according to the invention.

BRIEF DESCRIPTION OF THE DRAWINGS

Other characteristics and advantages will become clear after reading a preferred embodiment given as a non-limitative example disclosed with reference to the figures in which.

DETAILED PRESENTATION OF PARTICULAR EMBODIMENTS

FIG. 1 has already been commented upon in the preamble and will not be commented upon again.

According to one example embodiment of the invention described with reference to FIG. 2a, a segment of an electrical line 1 is protected by a protection system that comprises protection relays 2 and 3 and a monitoring and external control equipment 4.

The protection relays 2 and 3 are connected to the line 1 through a transformer 18 so as to acquire analogue information about the state of the line.

The secondary circuit of the transformer 18 is connected to the primary circuits of transformers 20 and 30 that are air gap transformers. The secondary circuit of the transformer 20 outputs current information to the protection relay 2 and more precisely to a control circuit 16 included in the relay 2. Similarly, the secondary circuit of the transformer 30 outputs current information to the protection relay 3 and more precisely to a control circuit 14 included in the relay 3. Thus, current acquisition on the line 1 is done in two steps, by transformers 18, 20 and 30. Each transformer 20 and 30 is fitted with a device according to the invention.

The protection relay 3 is used to modify operation of the protection relay 2. To achieve this, an output 9 from the protection relay 3 is connected to an input to a state acquisition device 19, integrated into or associated with the protection relay 2.

The protection system is powered by a battery 8 to provide a secure power supply for the protection system.

An input to the control circuit 14 of the protection relay 3 receives information about the state of the line 1 through the transformer 30. An output from the control circuit 14 is connected to a contact 10. The contact 10 is controlled by the circuit 14 so that the state acquisition device 19 of the protection relay 2 is powered by the battery 8 when the contact 10 is closed.

The protection relay 2 uses the information thus transmitted by the relay 3 together with data output from its own control circuit 16 to determine an action to be undertaken. An output from the control circuit 16 is connected to a contact 12, the output 5 of which is itself connected to a trip circuit 6.

The trip circuit 6 controls operation of a circuit breaker 7 connected in series with the line to be protected 1, to control the current.

The external monitoring and control equipment 4 is a contact from external equipment, not shown.

Figure 2A:
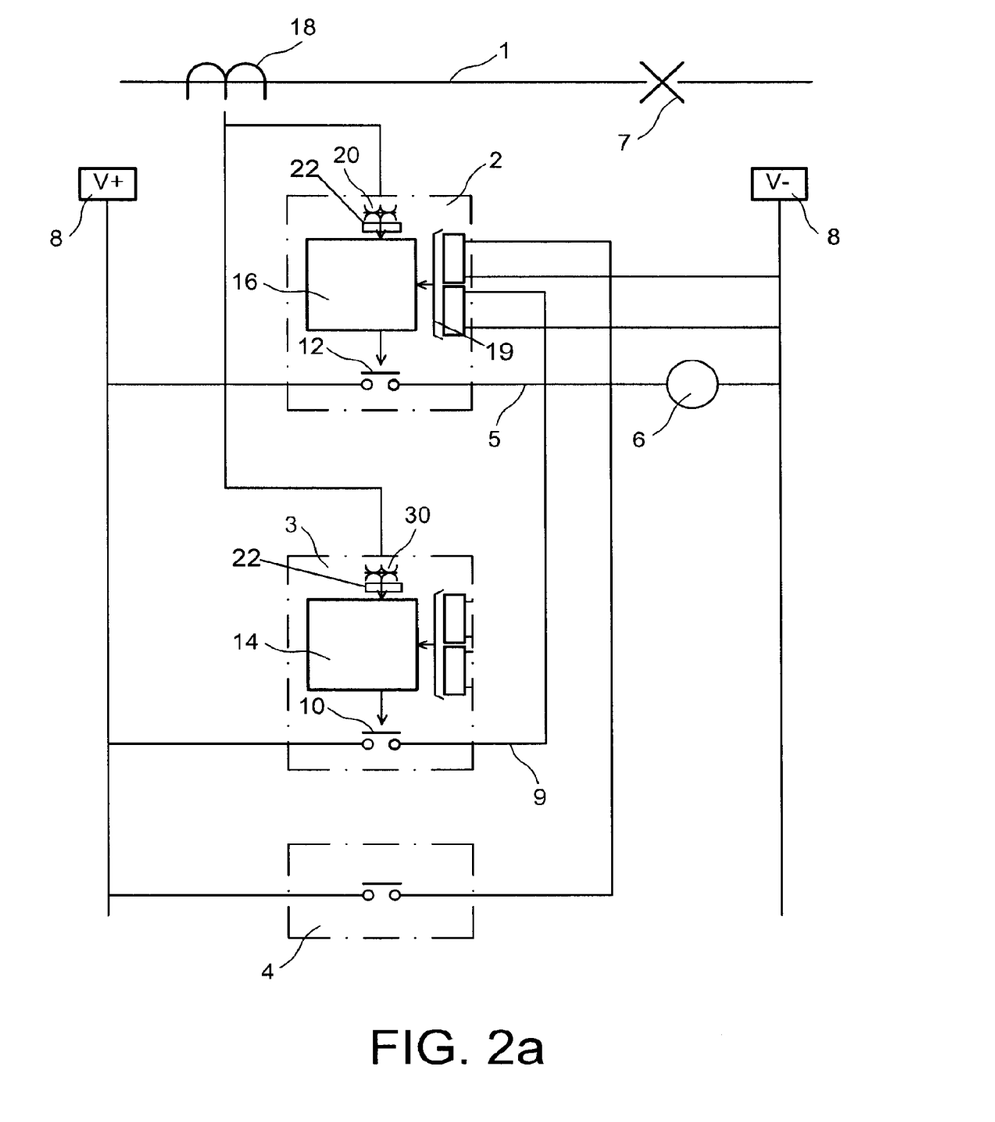
FIG. 2a shows an example embodiment of the invention.
Figure 2B:
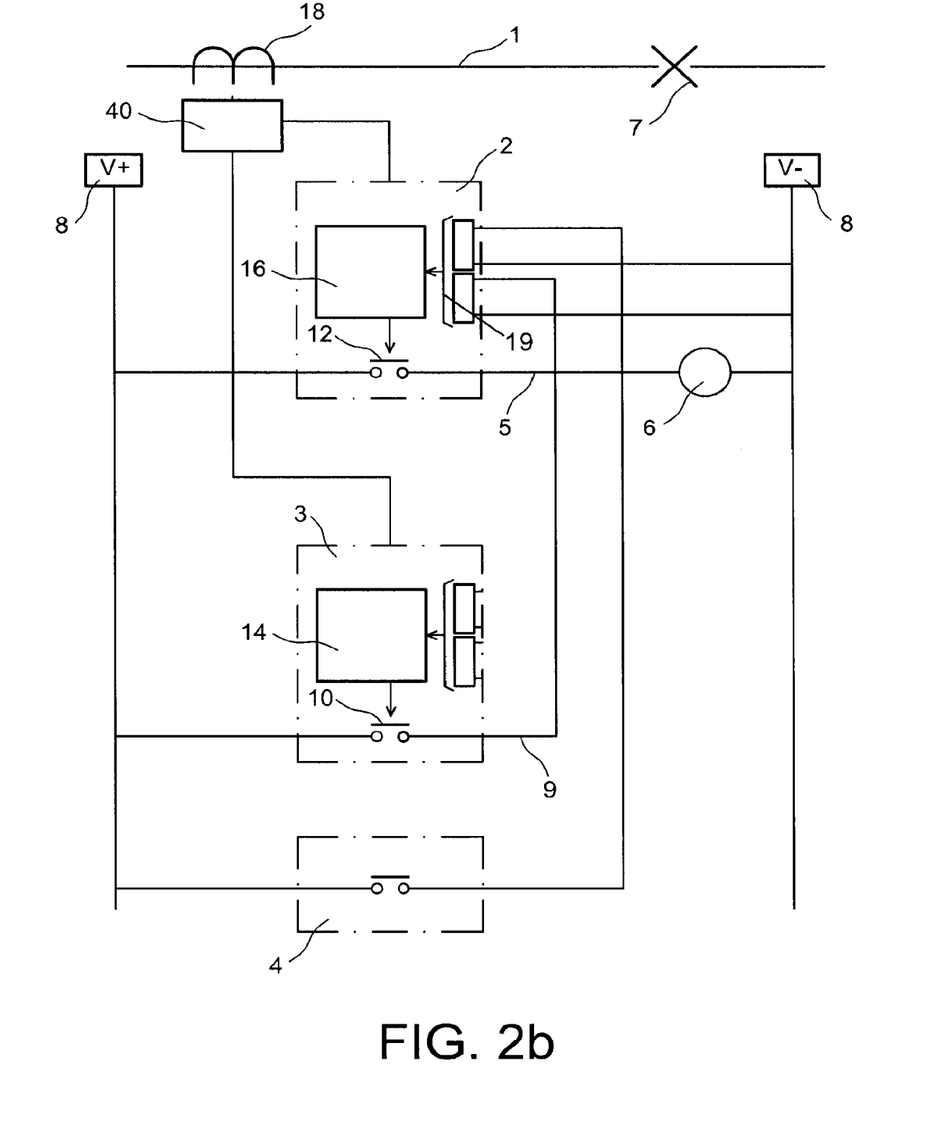
FIG. 2b shows another example embodiment of the invention.

FIG. 2b shows another example embodiment of the invention. As in FIG. 2a, a segment of the electrical line 1 is protected by a protection system that comprises protection relays 2 and 3 and external monitoring and control equipment 4. The same numerical references are assigned to similar elements in FIGS. 2b and 2a. Only the differences from FIG. 2a will be described in the following.

The protection relays 2 and 3 are connected to the line 1 through a transformer 18 so as to acquire analogue information about the state of the line. In this example, the transformer 18 is an air gap transformer that measures the electrical current in the line 1. The transformer 18 contains a device according to the invention.

The secondary circuit of the transformer 18 is connected to an input to a control circuit 40. An output from the control circuit 40 is connected to each of the protection relays 2 and 3. Unlike FIG. 2a, the protection relays 2 and 3 do not contain any transformers.

Figure 3:
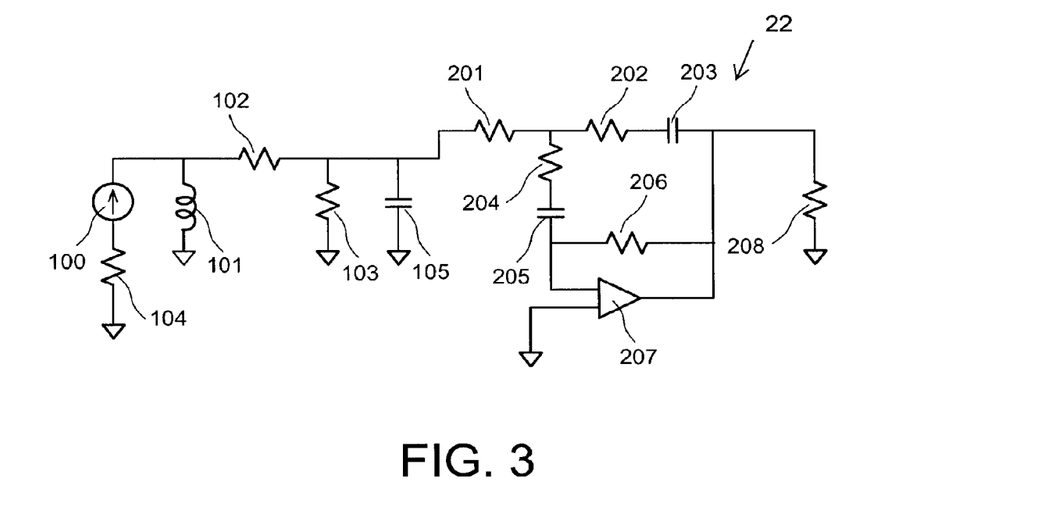
FIG. 3 shows an electrical circuit modelling an air gap transformer on which a correction device according to the invention is installed.

With reference to FIG. 3, an air gap transformer provided with a passband correction system according to the invention is modelled by an equivalent electrical circuit.

To model the transformer, the electrical circuit essentially comprises a current source 100, an inductor 101 and a resistor 102. The current source 100 represents a perfect current transformer with a transformation ratio of 1:1. The inductor 101 models the magnetisation inductance as seen by the secondary of the transformer. The resistor 102 represents the internal resistance of the secondary winding of the transformer.

More precisely, starting from an earthing terminal, the circuit comprises a resistor 104 connected to a terminal of the current source 100. The other terminal of the current source 100 is connected to a terminal of the inductor 101 and a terminal of the resistor 102. The resistor 104 is used to measure the current injected into the transformer.

The other terminal of the inductor 101 is connected to the earth, and the other terminal of the resistor 102 is connected to a terminal of a measurement resistor 103. The other terminal of the resistor 103 is connected to the earth.

Finally, a capacitor 105 is connected in parallel to the measurement resistor 103. The capacitor 105 limits high frequencies due to any EMC disturbances.

The passband correction device 22 (as illustrated in FIG. 2a, for instance, and modeled by FIG. 3) is modelled by a first order filter. The correction filter comprises, starting from the terminal common to resistors 102 and 103, a resistor 201, the other terminal of which is connected to two parallel branches. The first branch comprises a resistor 202 in series with a capacitor 203. The second branch comprises a resistor 204 connected in series with a capacitor 205 itself connected in series with a resistor 206. An operational amplifier 207 is connected in parallel to the resistor 206. The inverting input of the operational amplifier 207 is connected between the capacitor 205 and the resistor 206 and its non-inverting input is connected to the earth. The output from the operational amplifier 207 is connected to the common terminal of resistor 206 and the capacitor 203. Finally, this common terminal is connected to a terminal of a resistor 208, the other terminal of which is connected to the earth.

As a variant, the correction device 22 does not include resistors 204 and 206 nor capacitor 205. In this case it only comprises resistors 201 and 202, the capacitor 203 and the amplifier 207.

The time constant of the equivalent circuit of the transformer is L/R, where L is the inductance of the inductor 101 and R is the total resistance, namely the sum of resistances of resistors 102 and 103.

The correction device is designed such that its time constant is equal to the time constant of the transformer. The time constant of the correction device is given by the product $R_c C_c$, where $R_c$ is the resistance of the resistor 201 and the resistor 202 and $C_c$ is the capacitance of the capacitor 203. In other words, the cut-off frequency of the correction filter is equal to the cut-off frequency of the air gap transformer.

Values of $R_c$ and $C_c$ are chosen so that $R_c C_c = L/R$. It should be noted that the quantity L/R can easily be measured because the cut-off frequency of the air gap transformer is equal to $1/(2.\pi.L/R)$.

Figure 4A:
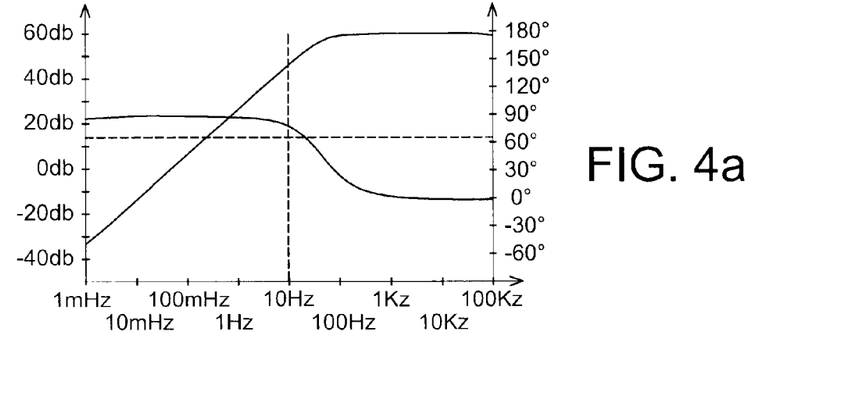
FIG. 4a shows the Bode diagram of the air gap transformer without the correction device.

FIG. 4a shows the Bode diagram for the air gap transformer without the correction device.

The gain curve (left scale) increases up to the cut-off frequency that is equal to about 100 Hz in the example shown, and is then approximately constant. The phase curve (right scale) shows that there is a phase shift of about 90 degrees below 5 Hz, and the phase shift then reduces and becomes zero above 1 kHz.

Figure 4B:
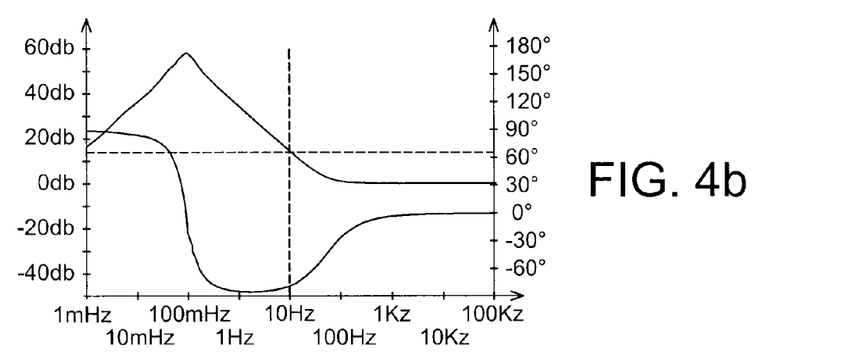
FIG. 4b shows the Bode diagram of the correction device.

FIG. 4b shows the Bode diagram for the correction device.

The gain curve (left scale) increases up to the cut-off frequency that is about 100 mHz in the example shown, then decreases to about 100 Hz and is finally constant above this value. The correction device thus acts as an amplifier in a frequency band below the cut-off frequency of the air gap transformer.

The phase curve (right scale) shows the existence of a phase shift of about 90 degrees below 10 mHz, then a fast reduction in the phase shift up to about 1 Hz, an increase up to about 1 kHz and finally a zero phase shift above 1 kHz.

Figure 4C:
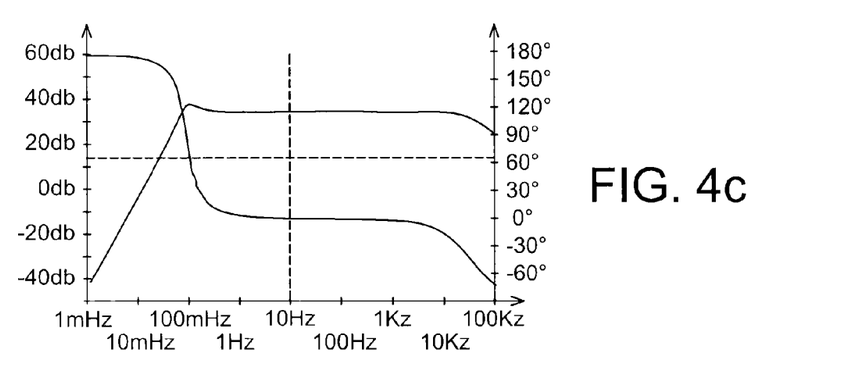
FIG. 4c shows the Bode diagram of the air gap transformer with the correction device.

FIG. 4c shows the Bode diagram of the air gap transformer fitted with the correction device.

The gain curve (left scale) increases up to the cut-off frequency that is equal to about 100 mHz in the example shown, then has a small peak and finally becomes approximately constant up to about 10 kHz, and finally decreases above 10 kHz. It can be seen that the cut-off frequency of the air gap transformer fitted with the correction device is lower than the cut-off frequency of the air gap transformer without the correction device.

The phase curve (right scale) shows that there is a phase shift of about 180 degrees below 10 mHz, and then a fast reduction of the phase shift that becomes zero above 1 Hz, and then decreases again above 1 kHz.

Thus, the air gap transformer fitted with the correction device has a constant gain within a frequency range varying from 0.2 Hz to 10 kHz in the example shown, and a zero phase shift in a frequency range varying from 1 Hz to 1 kHz in the example shown. The passband of the transformer has been increased to become similar to the passband of a transformer with a smaller air gap. The phase shift of the transformer has been corrected.

Figure 5:
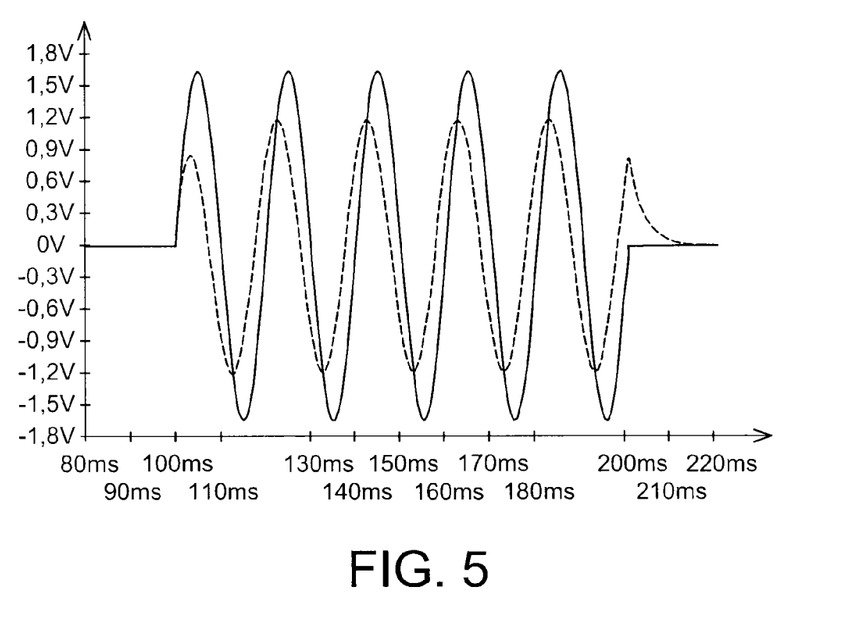
FIG. 5 shows the time response of the air gap transformer with and without the correction device.

FIG. 5 shows the time response of the air gap transformer with and without the correction device.

The curve in dashed lines shows the voltage measured at the terminals of the resistor 103, in other words at the transformer output. This voltage is proportional to the transformer output current. The curve in solid lines shows the input voltage to the transformer, at the terminals of the inductor 101.

When power is applied (at 100 ms), the output current has a transient condition during which the amplitude of the signal has not yet reached its nominal value. Similarly, when the voltage becomes zero at the transformer input (at 200 ms), the output current has a transient condition before becoming zero.

The phase of the transformer output current is shifted from the phase of the input voltage.

The output voltage from the correction device measured at the terminals of the resistor 208, is superposed on the input voltage. Due to the correction, there is no longer any transient condition nor phase shift.

According to one preferred embodiment, an attempt is also made not to amplify the low frequencies of the signal, to not create any instability.

In this case, the correction filter is an order 2 filter. It comprises a derivator, in other words a high pass filter that acts on low frequencies. More precisely, since the correction filter is essentially an integrator filter, in other words a low pass filter, two derivators are provided, one to compensate for the integrator and the other to effectively obtain a derivator.

The cut-off angular frequency $\omega_0$ between the double derivator at low frequencies and the integrator at medium frequencies is lower than the cut-off angular frequency of the air gap transformer that is equal to $(L/R)^{-1}$.

In the Laplace range, the transfer function of the correction filter can then be written:

$$H(s) = \frac{1}{\frac{L}{R} \cdot \omega_0^2} \cdot \frac{\left(1 + \frac{L}{R} \cdot s\right) \cdot s}{1 + \frac{1}{Q} \cdot \left(\frac{s}{\omega_0}\right) + \left(\frac{s}{\omega_0}\right)^2}$$

In this formula, the Laplace operator is denoted s and Q is a quality factor.

At low frequencies, in other words for an angular frequency below the cut-off angular frequency $\omega_0$ of the correction filter, the transfer function is equal to approximately:

$$H(s) = \frac{1}{\frac{L}{R} \cdot \omega_0^2} \cdot \frac{(1+0) \cdot s}{1 + \frac{1}{Q} \cdot (0) + (0)^2} \approx \alpha \cdot s$$

This is the transfer function of a first order high pass filter with positive gradient.

The transfer function between the cut-off angular frequency $\omega_0$ of the correction filter and the cut-off angular frequency of the air gap transformer $(2.\pi.L/R)^{-1}$ is equal to approximately:

$$H(s) = \frac{1}{\frac{L}{R} \cdot \omega_0^2} \cdot \frac{(1+0) \cdot s}{\left(\frac{s}{\omega_0}\right)^2} \approx \frac{\alpha}{s}$$

This is the transfer function of a first order high pass filter with negative gradient.

The transfer function above the cut-off angular frequency of the air gap transformer $(L/R)^{-1}$ is equal to approximately:

$$H(s) = \frac{1}{\frac{L}{R} \cdot \omega_0^2} \cdot \frac{\left(\frac{L}{R} \cdot s\right) \cdot s}{\left(\frac{s}{\omega_0}\right)^2} \approx 1$$

Therefore this is a constant response. The correction filter then has a constant gain.

As a variant, the correction filter may be of an order higher than 2, by putting order 1 and 2 filters in cascade.

The correction filter described is an analogue filter. Starting from its transfer function H(s) expressed in the Laplace domain, the corresponding digital filter H(z) can be determined by using the Z transform.

Conventionally, the change from the analogue transfer function to its digital approximation is made using the Euler transformation $s=(1-z^{-1})/T$, or bilinear transformation $$s = \frac{2}{T} \cdot \frac{1-z^{-1}}{1+z^{-1}},$$

in which T is the sampling period.

An infinite pulse response filter is then deduced in the form:

$$y_n = \frac{1}{b_0} \cdot (a_0 \cdot x_n + a_1 \cdot x_{n-1} + a_2 x_{n-2} - b_1 \cdot y_{n-1} - b_2 \cdot y_{n-2})$$

The digital correction filter is applied by a dedicated integrated circuit or by programmable processors, or in the form of a computer program stored in a computer memory.

Figure 6:
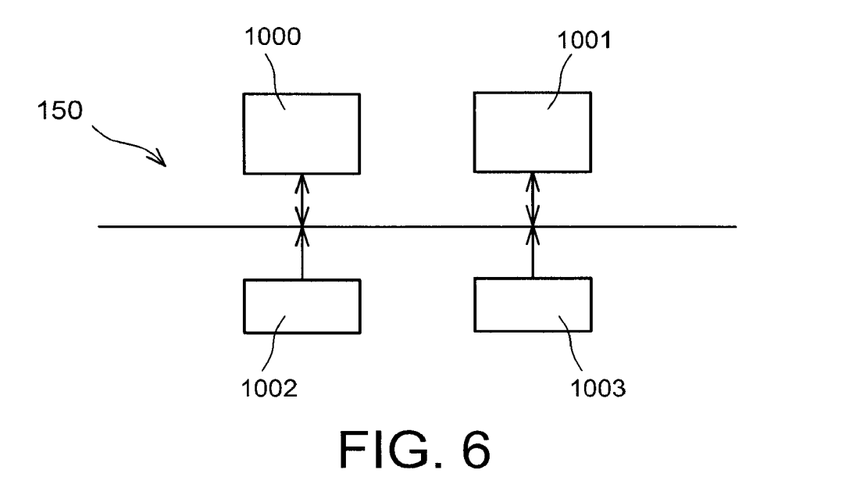
FIG. 6 shows an embodiment of the device according to the invention.

Thus, FIG. 6 shows a particular embodiment of the device according to the invention.

The device 150 has the same general structure as a computer. In particular it comprises a processor 1000 running a computer program applying the method according to the invention, a memory 1001, an input interface 1002 and an output interface 1003.

These different elements are conventionally connected by a bus.

The input interface 1002 will receive the current values measured at the output from an air gap transformer.

The processor 1000 runs the previously described processing. This processing is done in the form of instructions of a computer program code stored in the memory 1001 before being run by the processor 1000.

The memory 1001 may also store the results of the processing done.

The output interface 1003 is connected to a protection relay.

Figure 7:
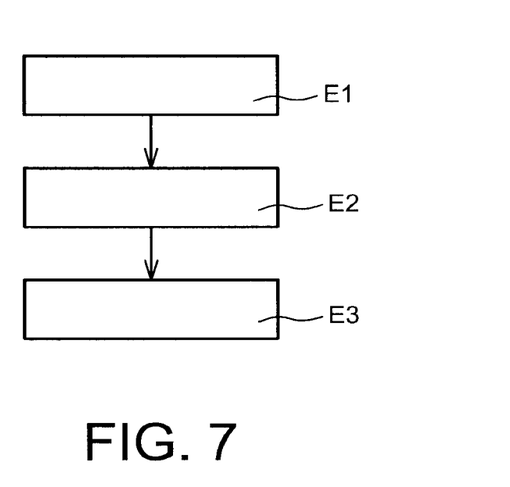
FIG. 7 shows an embodiment of the passband correction method for an air gap transformer, according to the invention.

With reference to FIG. 7, the passband correction method for an air gap transformer according to the invention used by the device described above, comprises steps E1 to E3.

Step E1 is to measure the values of a current signal at the output from the air gap transformer.

The next step E2 is to filter the measured values that amplifies the current signal for frequencies below the cut-off frequency of the transformer. The result is a set of filtered values.

The next step E3 is to supply filtered values to a protection relay.

The invention claimed is:

1. A protection relay comprising:
   a correction device to correct a passband of an air gap transformer with a cut-off frequency and adapted to be connected to an output side of the air gap transformer, wherein the correction device includes:
   a filter adapted to be connected to the output side of the air gap transformer in series, the filter being configured to amplify a signal received from the output side of the air gap transformer for frequencies below the cut-off frequency of the air gap transformer, such that the passband of the air gap transformer, when fitted with the correction device, is effectively increased and has an effective cut-off frequency lower than the cut-off frequency of the air gap transformer.

2. A method to correct a passband of an air gap transformer with a cut-off frequency, the method comprising:
   measuring, using an adjustment device of a protection relay, values of a current signal at an output of the air gap transformer, and
   filtering, using a filter of the adjustment device adapted to be connected to the output of the air gap transformer in series, measured values to amplify the current signal for frequencies lower than the cut-off frequency of the air-gap transformer, such that the passband of the air-gap transformer fitted with the adjustment device is effectively enlarged and has an effective cut-off frequency lower than the cut-off frequency of the air gap transformer.

3. The protection relay according to claim 1, wherein the filter is a first order filter for which a cut-off frequency thereof is equal to the cut-off frequency of the air gap transformer.

4. The protection relay according to claim 1, wherein the filter has an order greater than or equal to two, with a cut-off frequency lower than the cut-off frequency of the air gap transformer, and is configured to operate as a derivative filter for frequencies lower than the cut-off frequency of the filter, as an integrator filter for frequencies between the cut-off frequency of the filter and the cut-off frequency of the air gap transformer, and with a constant gain for frequencies higher than the cut-off frequency of the air gap transformer.

5. The protection relay according to claim 1, wherein the filter includes analog circuitry.

6. The protection relay according to claim 1, wherein the filter includes digital circuitry.

7. A protection relay according to claim 1, wherein the correction device is connected to the air gap transformer.

8. The protection relay according to claim 1, wherein the passband of the air gap transformer is at a higher frequency range than the cut-off frequency of the air gap transformer.

9. The protection relay according to claim 1, wherein the filter is configured to effectively move a portion of zero phase shift of the air gap transformer to a lower frequency range in correspondence with the effectively increased passband of the air gap.

* * * * *